United States Patent [19]

Carpenteri et al.

[11] Patent Number: 4,993,050

[45] Date of Patent: Feb. 12, 1991

[54] PORTABLE TOUCH ACTIVATED COUNTER/MARKER

[76] Inventors: Harry L. Carpenteri, 4 Dailey Cir., Vernon, Conn. 06066; Donald E. Hayes, P.O. Box 324, Brownville, Me. 04414

[21] Appl. No.: 325,908

[22] Filed: Mar. 20, 1989

[51] Int. Cl.[5] ........................ G06M 3/00; H03K 21/38

[52] U.S. Cl. ........................................ 377/15; 377/112; 235/64

[58] Field of Search ................ 377/6, 15, 112; 235/64

[56] References Cited

U.S. PATENT DOCUMENTS

| | | | |
|---|---|---|---|
| 1,007,350 | 10/1911 | Goodin | 235/64 |
| 4,295,038 | 10/1981 | Kreinbrink et al. | 377/6 |
| 4,532,642 | 7/1985 | Morris et al. | 377/15 |
| 4,726,044 | 2/1988 | Perna et al. | 377/15 |

FOREIGN PATENT DOCUMENTS

| | | | |
|---|---|---|---|
| 2542831 | 4/1977 | Fed. Rep. of Germany | 377/15 |
| 0210136 | 5/1984 | Fed. Rep. of Germany | 377/15 |
| 0058590 | 4/1984 | Japan | 377/15 |

*Primary Examiner*—John S. Heyman
*Attorney, Agent, or Firm*—Robert S. Smith

[57] ABSTRACT

A counter/marker apparatus which comprises a head assembly including a counter mechanism, a first elongated sleeve fixed to the head assembly, and a second elongated sleeve dimensioned and configured for sliding axial concentric movement within the first sleeve. The second elongated sleeve has an elongated slot therein extending in a generally axial direction. The apparatus also includes a momentary switch and apparatus for mounting the momentary switch to cause actuation of the momentary switch upon relative axial movement of the first and second elongated sleeves. Apparatus is provided for coupling the momentary swtich to the counter and for coupling the second sleeve to an associated pen. A set screw extending through the first sleeve to the elongated slot in the second sleeve to limit travel of the second sleeve relative to the first sleeve.

5 Claims, 2 Drawing Sheets

PORTABLE TOUCH ACTIVATED COUNTER/MARKER

BACKGROUND OF THE INVENTION

This invention relates generally to marking instruments capable of counting the number of marking strokes and more particularly to ball point, felt tip and other writing instruments in which the tip of the instrument is presses against an object to mark the object as well as to perform a counting operation.

Such apparatus has particular application, for example, to the counting of the holes in a target created by the pellets from a shot gun and it is particularly desirable to not only mark the holes that have already been counted as well as to perform a count. Other applications for such appartus include lumber yards where it is desirable to make a tally of shipments. Similarly, such apparatus also has applications in warehouses and stock rooms where it is desirable to count pallets, cartons, skids racks, boxes, tubes or other tangable goods.

The prior art includes apparatus of this general type such as that shown in U.S. Pat. No. 4,726,044. A problem with utilizing such apparatus is that the apparatus does not provide a way to differentiate the marks that are made, for example, at the end of one acconting period instead of a second counting period. For example, a blue check mark indicates that a given rack, box, tube, pallet or skid has been counted and the same symbol and color is used in a succeeding counting period then it would be difficult to establish whether a given item has been accounted for. The apparatus as shown in U.S. Pat. No. 4,726,044 does not permit easy change of the pen instrument used in a counting process.

It is an object of the invention to provide apparatus that is a combination marker and counter and which allows easy differentiation between marks made at different times.

More particularly it is an object of the invention to provide apparatus tht allows easy change of the pen instrument so that colors which are placed on the article being counted have a distinctive nature.

SUMMARY OF THE INVENTION

It has now been found that these and other objects of the invention may be attained in a counter/marker apparatus which comprises a head assembly including a counter mechanism, a first elongated sleeve fixed to the head assembly, and a second elongated sleeve dimensioned and configured for sliding axial concentric movement within the first sleeve. The second elongated sleeve has an elongated slot therein extending in a generally axial direction. The apparatus also includes a momentary switch; means for mounting the momentary switch to cause actuation of the momentary switch upon relative axial movement of the first and second elongated sleeves; means for coupling the momentary switch to the counter; means coupling the second sleeve to an associated pen; and a set screw extending through the first sleeve to the elongated slot in the second sleeve.

The apparatus may further include means biasing the second sleeve away from the momentary switch. The first sleeve may have a first ring shaped member disposed proximate to one axial extremity thereof. A second ring shaped member and means for securing the second ring shaped member to the associated pen, the first and second rings may be spaced aprat in one axial position of the second sleeve relative to the first sleeve and in abutting relationship in a second axial position of the second sleeve relative to the first sleeve. The counter mechanism may be an electronic device. A third sleeve shaped member may be dimensioned and configured for securing a pen therein and for engagement within the interior the second sleeve shaped member. The second sleeve shaped member may have a smaller diameter than the first sleeve shaped member. The assembly may include a clip for engagement with the belt of the user. The counter may include a reset button. The apparatus may also include an on/off switch for turning the counter mechanism on and off.

BRIEF DESCRIPTION OF THE DRAWING

The invention will be better understood by reference to the accompanying drawing in which.

DESCRIPTION OF THE PREFERRED EMBODIMENT

Figure 1:
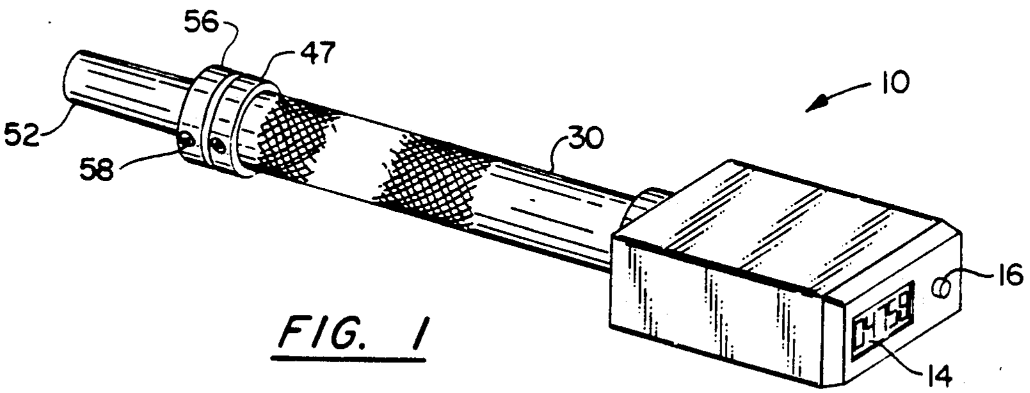
FIG. 1 is a perspective view of one form of the apparatus in accordance with the invention.
Figure 3:
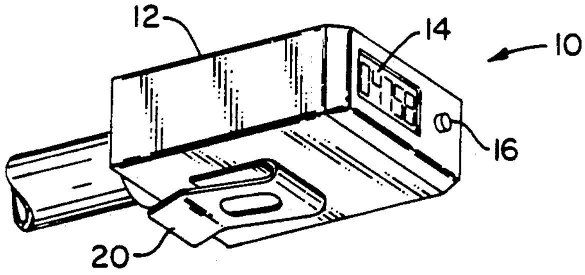
FIG. 3 is a broken away perspective view showing in greater detail the clip mechanism for the head of the apparatus shown in FIG. 1.

Referring now to FIGS. 1–4 there is shown a touch activated counter/marker 10 in accordance with one form of the invention. The counter/marker 10 includes a head 12 in which is mounted a digital display 14, a reset button 16 and an on/off switch 18. The head 12 is also provided with a clip 20 for positioning counter/-marker 10 on the belt of a user. A counter 22 is commercially available product which is manufactured by Red Lion Controls, Willowsprings Circle, RD 5, York, Pa. 17402 and identified as the cub #3 model.

Figure 2:
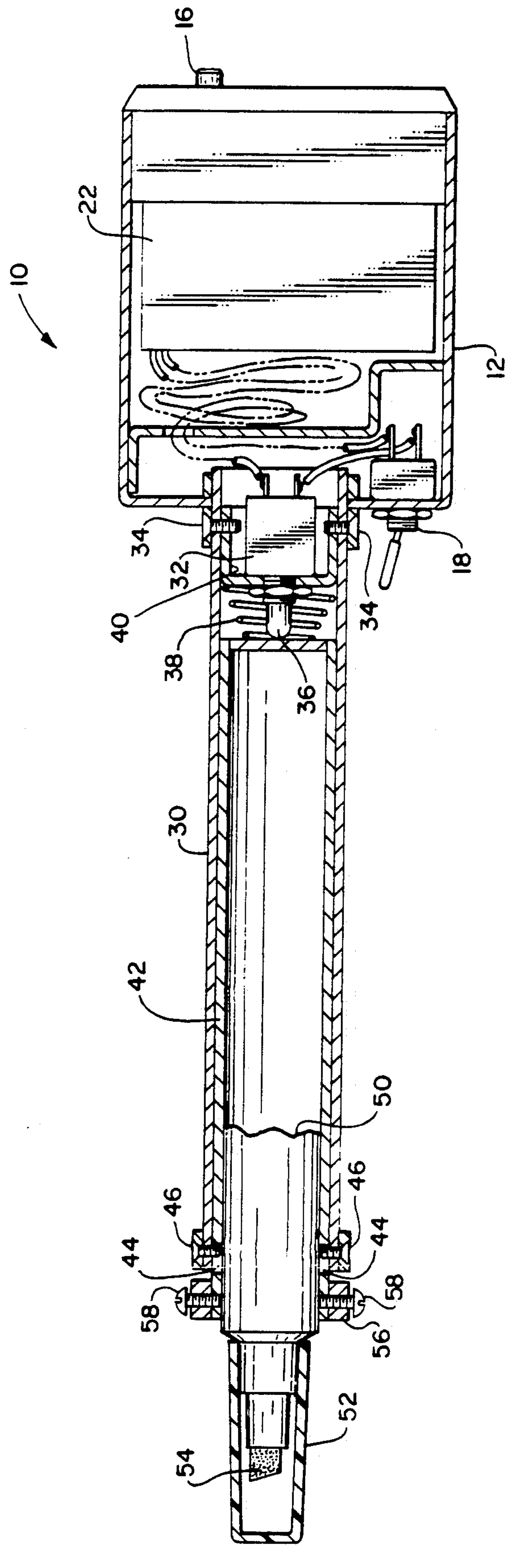
FIG. 2 is a sectional view taken along the axis of the apparatus shown in FIG. 1.

Fixed to the head 12 is a first sleeve 30 which has the right most, as viewed in FIG. 2, extremity peened over to engage securely the head 12. A momentary switch 32 is mounted by screws 34, 34 to the first sleeve 30. The momentary switch 32 has output terminals which are coupled to the counter 22 and completes a circuit to the counter 22 each time the tip 36 is depressed. In other words, each time the tip 36 is moved from the position shown in FIG. 2 to a position which is approximately and eighth of an inch or more to the right as viewed in FIG. 2. A spring 38, which is cone shaped, extends from the support 40 for the momentary switch 32 to the closed end of a second sleeve 42 which is concentric with the first sleeve 30. More particularly, the second sleeve 42 is dimensioned and configured for sliding movement with the first sleeve 30. The second sleeve 42 is provided with two opposed elongated holes 44. The elongation is generally in the direction of the axis of the first sleeve 30 and the axis of the second sleeve 42. Accordingly, the spring 38 forces the second sleeve 42 to the position shown in FIG. 2 with the set screws 46, 46 disposed in abutting relationship to the right most, as viewed in FIG. 2, portion of the elongated holes 44, 44.

Disposed within the second sleeve 42 is a felt tip pen 50 which includes a cap 52 and a tip 54. A stop ring 56 is secured by set screws 58, 58 to the first sleeve 30. The set screws 58 pass through the second sleeve 42 and engage the felt tip pen 50 in place as shown in FIGS. 1 and 2.

In use the cap 52 is removed and each time the tip 54 is pushed against a box or paper or other object, the force is transmitted through the felt tip pen 50 to the set screws 58 and thus to the second sleeve 42 and thence to the spring 38 and thereby depress the tip 36 of the momentary switch 32 causing a circuit to be completed to the counter 22 which will be incremented during the movement cycle. Movement of the second sleeve 42 to the right most position is ordinarily limited by the stop ring 56 although in some embodiments, the limitation on travel may be attained by the size of the elongated hole 44.

The screws 46, 46 are carried in a ring 47 having substantially the same outside diameter as the ring 56.

The pen 50, 62 is easily removed by withdrawing the screws 58, 58.

The marker 50 or 62 may be used merely for marking without counting by moving the toggle switch 18 to the off position.

Ordinarily, the pen 62, 50 may be replaced merely by loosening the set screws 58 in ordinarily only one full turn is necessary of each of the screws 58, 58. In the case of the pen 62 carried in a sleeve 60, the set screw 64 is removed to replace the pen 62. It will thus be seen that an easy change of color may be accomplished very readily.

Figure 4:
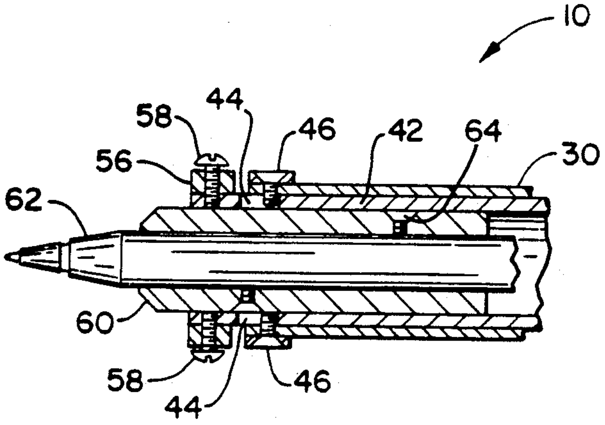
FIG. 4 is a broken away cross sectional view of the tip portion of the apparatus shown in FIG. 1 and illustrating more particularly an adapter sleeve for accommodating a conventional ball point pen in the apparatus.

In the alternate embodiment shown in FIG. 4, a sleeve 60 surrounds a conventional ball point pen or other slimmer felt tip pen 62 and is secured therein by a screw 64. In other respects, the apparatus shown in FIG. 4 is substantially the same as the apparatus shown in FIG. 2. In some forms of the invention a soft rubber protective cap may be disposed over the tip of the pen to allow counting without color marking, scratching or damage to delicate items.

It will thus be seen that a sports person or shot gunner can count the pellet hits within a circle or a lumber yard where he can tally his shipments in a matter of minutes and a warehouse worker can count and mark pallets, cartons and skids just as a stockroom worker can do the same with racks, boxes and tubes. Similarly, a truck driver can count and mark his cargo. The apparatus in accordance with the invention is particularly advantageous because of the easy replacement of the pen 62 or 50 which enable the user to quickly and easily change the pen 50 or 62 and thus the color of the marks to easily differentiate marks made on different dates. The user may, for example, adapt specific colors for various calander quarters of the year.

The invention has been described with reference to its illustrated preferred embodiment. Persons skilled in the art of such devices may upon exposure to the teachings herein, conceive other variations. Such variations are deemed to be encompassed by the disclosure, the invention being delimited only by the appended claims.

Having thus described my invention I claim:

1. A counter/marker apparatus which comprises:

a head assembly including an electronic counter mechanism;

a first elongated sleeve fixed to said head assembly;

a second elongted sleeve dimensioned and configured for sliding axial concentric movement within said first sleeve, said second elongated sleeve having an elongated slot therein extending in a generally axial direction;

a momentary switch;

means for mounting said momentary switch to cause actuation of said momentary switch upon relative axial movement of said first and second elongated sleeves;

means for coupling said momentary switch to said counter;

means for physically coupling said second sleeve to an associated pen;

a set screw extending through said first to said elongated slot in said second sleeve;

means biasing said second sleeve away from said momentary switch;

said first sleeve having a first ring shaped member disposed proximate to one axial extremity thereof;

a second ring shaped member and means for securing said second ring shaped member to the associated pen, said first and second rings being spaced apart from said first sleeve in one axial position of said second sleeve and in abutting relationship to said first sleeve in a second axial position of said second sleeve; and wherein said physically coupling means comprises a third sleeve shaped member dimensioned and configured for securing the pen therein and for engagement within the interior of said second sleeve shaped member.

2. The apparatus as described in claim 1 wherein:

said second sleeve shaped member has a smaller diameter than said first sleeve shaped member.

3. The apparatus as described in claim 2 wherein:

said assembly includes a clip for engagement with the belt of the user.

4. The apparatus as described in claim 3 wherein:

counter includes a reset button.

5. The apparatus as described in claim 4 further including:

an on/off switch for turning said counter mechanism on and off.

* * * * *